(12) United States Patent
Choi et al.

(10) Patent No.: US 9,118,324 B2
(45) Date of Patent: Aug. 25, 2015

(54) DRIVER IC CHIP AND PAD LAYOUT METHOD THEREOF

(71) Applicant: SILICON WORKS CO., LTD., Daejeon-si (KR)

(72) Inventors: Jeong Cheul Choi, Daejeon-si (KR); An Young Kim, Daejeon-si (KR); Joon Ho Na, Daejeon-si (KR); Dae Seong Kim, Daejeon-si (KR); Dae Keun Han, Daejeon-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 27 days.

(21) Appl. No.: 13/971,558

(22) Filed: Aug. 20, 2013

(65) Prior Publication Data

US 2013/0335123 A1    Dec. 19, 2013

Related U.S. Application Data

(63) Continuation-in-part of application No. 12/997,206, filed as application No. PCT/KR2009/002692 on May 22, 2009, now Pat. No. 8,541,888.

(30) Foreign Application Priority Data

Jun. 16, 2008    (KR) .................. 10-2008-0056179

(51) Int. Cl.
*H03K 17/16* (2006.01)
*G09G 3/36* (2006.01)
*G09G 3/20* (2006.01)

(52) U.S. Cl.
CPC ............ *H03K 17/165* (2013.01); *G09G 3/3648* (2013.01); *G09G 3/2092* (2013.01); *G09G 2300/0426* (2013.01); *Y10T 156/10* (2015.01)

(58) Field of Classification Search
CPC ........... H01L 2924/10329; H01L 2924/10335; H01L 29/04; H01L 29/0626; H01L 29/063; H01L 29/0847; H01L 29/0878; H01L 29/1083; H01L 29/1087; H01L 29/1095; H01L 29/16; H01L 29/407; H01L 29/41733; H01L 29/66371; H01L 29/66492; H01L 29/66659; H01L 29/6675; H01L 29/66969; H01L 29/7302; H01L 29/735; H01L 29/78; H01L 29/7811; H01L 29/7816; H01L 29/782; H01L 29/7824; H01L 29/7835; H01L 51/0054; H01L 51/0058; H01L 51/0059; H01L 51/0061; H01L 51/0065; H01L 51/0067; H01L 51/0071; H01L 51/0081; H01L 51/0085; H01L 51/5016; H01L 51/5096; H01L 51/56; H01L 2924/00014; H01L 2224/05599; H01L 2224/85399; H01L 2224/45099; H01L 2924/0002; H01L 24/06; H01L 2924/00; H01L 2924/01004; H01L 2924/01006; H01L 2924/01014; H01L 2924/01033; H01L 2924/14
See application file for complete search history.

(56) References Cited

U.S. PATENT DOCUMENTS 6,160,307 A  *  12/2000  Kweon ......................... 257/676
RE37,539 E  *   2/2002  Oguchi et al. ............... 257/686
(Continued)

FOREIGN PATENT DOCUMENTS

JP         11-95241        4/1999
JP         11-295756       10/1999
(Continued)

*Primary Examiner* — Stephen W Smoot
*Assistant Examiner* — Edward Chin
(74) *Attorney, Agent, or Firm* — Kile Park Reed & Houtteman PLLC (57) ABSTRACT

Provided is a driver IC chip of a liquid crystal display (LCD). The driver IC chip has a layout of power pads, which may uniformly apply an adhesive force on the entire adhesion surface of the driver IC chip, when the driver IC chip is mounted on a display panel according to a chip-on-glass (COG) technique.

18 Claims, 4 Drawing Sheets

(56) References Cited

U.S. PATENT DOCUMENTS

| | | | | |
|---|---|---|---|---|
| 7,283,130 | B2* | 10/2007 | Takenaka et al. | 345/206 |
| 7,567,231 | B2* | 7/2009 | Takahashi et al. | 345/100 |
| 7,732,933 | B2* | 6/2010 | Chung et al. | 257/779 |
| 7,800,913 | B2* | 9/2010 | Torii et al. | 361/749 |
| 8,138,792 | B2* | 3/2012 | Chang et al. | 326/47 |
| 8,279,617 | B2* | 10/2012 | Choi et al. | 361/767 |
| 8,299,597 | B2* | 10/2012 | Choi et al. | 257/690 |
| 8,324,735 | B2* | 12/2012 | Higuchi | 257/775 |
| 8,624,406 | B2* | 1/2014 | Murahashi et al. | 257/784 |
| 2004/0212969 | A1* | 10/2004 | Imamura et al. | 361/760 |
| 2007/0138654 | A1* | 6/2007 | Kim | 257/786 |
| 2007/0188693 | A1* | 8/2007 | Hwang et al. | 349/152 |
| 2011/0075390 | A1* | 3/2011 | Choi et al. | 361/783 |
| 2011/0248972 | A1* | 10/2011 | Ahn et al. | 345/206 |
| 2012/0068349 | A1* | 3/2012 | Kim et al. | 257/773 |

FOREIGN PATENT DOCUMENTS

| | | |
|---|---|---|
| KR | 10-2006-0034034 | 4/2006 |
| KR | 10-2008-0000369 | 1/2008 |

\* cited by examiner

Fig. 2

DRIVER IC CHIP AND PAD LAYOUT METHOD THEREOF

CROSS REFERENCE TO RELATED APPLICATIONS

This application is a continuation-in-part application of U.S. patent application Ser. No. 12/997,206, filed Dec. 9, 2010 (now pending), the disclosure of which is herein incorporated by reference in its entirety. The U.S. patent application Ser. No. 12/997,206 is a national entry of International Application No. PCT/KR2009/002692, filed on May 22, 2009, which claims priority to Korean Application No. 10-2008-0056179 filed on Jun. 16, 2008, the entire contents of which are incorporated herein by reference.

BACKGROUND OF THE INVENTION

1. Field of the Invention

The present invention relates to a driver IC chip, and more particularly, to a driver IC chip and a pad layout method thereof, which are capable of improving adhesion performance of a driver IC mounted through a chip-on-glass (COG) technique.

2. Description of the Related Art

Liquid crystal displays (LCD) refer to devices which displays image data by passing light through liquid crystal, using a characteristic that the alignment state of liquid crystal molecules differ depending on an applied voltage. Recently, a thin film transistor (TFT) LCD has been most actively used among the devices. The TFT LCD is fabricated through a technology for fabricating a silicon IC circuit.

The above-described LCD is an example of flat panel display devices which may include an organic light emitting diode (OLED) and the like.

Figure 1:
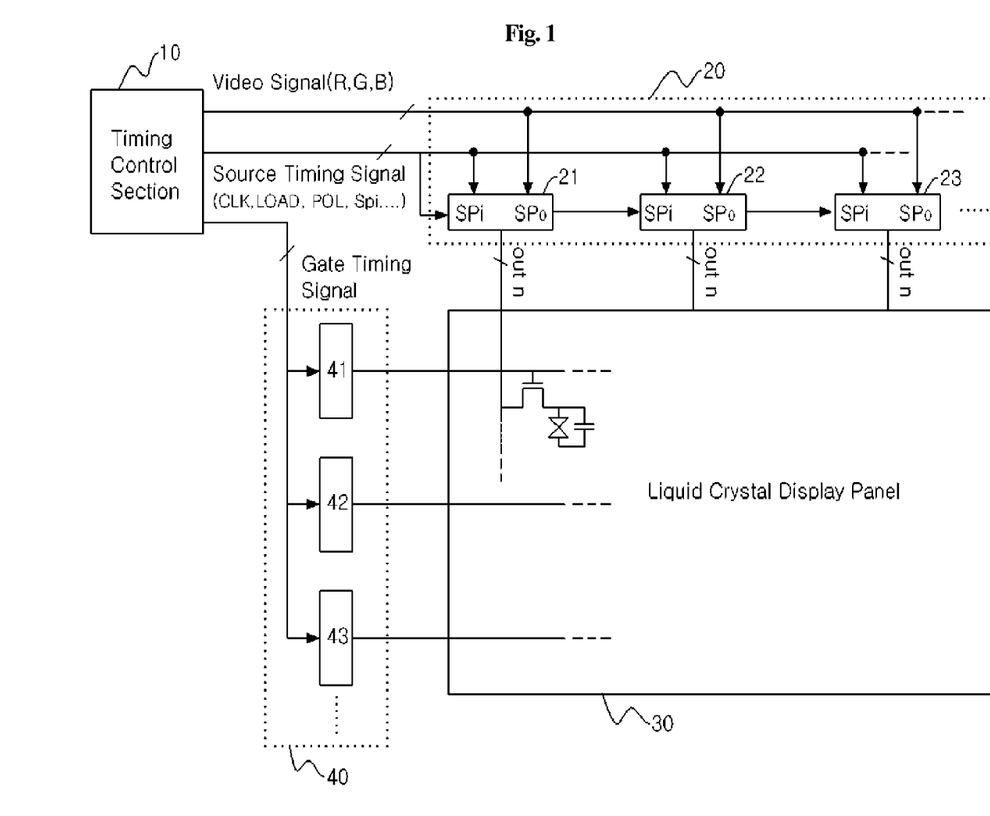
FIG. 1 schematically illustrates the structure of a conventional LCD as an example of flat panel displays.

FIG. 1 schematically illustrates the structure of a conventional LCD as an example of flat panel displays.

The TFT LCD includes a TFT array substrate and a color filter substrate which face each other and are bonded to each other with a predetermined space provided therebetween. The TFT LCD further includes an LCD panel 30 formed by injecting an liquid crystal layer into the predetermined space and a driving circuit for driving the LCD panel 30.

The driving circuit includes a gate driver IC 40, a source driver IC 20, a timing control unit 10, and a power supply unit (not illustrated). The gate driver IC 40 is configured to sequentially apply a scanning signal to gate lines at each frame, the source driver IC 20 is configured to drive a source line in response to the scanning signal of the gate driver IC 40, the timing control unit 10 is configured to control the gate driver IC 40 and the source driver IC 20 and output pixel data, and the power supply unit is configured to supply various voltages used in the LCD.

In general, a method for connecting the driver IC to the LCD panel may include a tape automated bonding (TAB) method and a COG method. According to the TAB method, a driver IC is mounted on a thin flexible film made of polymer, that is, a tape carrier package (TCP), and the film is connected to the LCD so as to electrically connect between the driver IC and the LCD panel. According to the COG method, the driver IC is directly mounted and connected on a glass substrate of a LCD panel through a bump.

Conventionally, the TAB method has been frequently used because the TAB method has reliable connection and may be easily improved. Recently, however, with the development of micro mounting technology, the COG method has been mainly used because the COG method is favorable to miniaturization and has a low fabrication cost.

According to the COG method, an output electrode of a driver IC is directly connected to a pad so as to integrate a substrate and the driver IC. In the COG method, a bump and the pad are bonded through conductive particles positioned between the bump and the pad.

Furthermore, driver IC chips mounted on an LCD panel are connected to each other according to a line-on-glass (LOG) method in which signal lines are directly mounted on a TFT array substrate, and receive a control signal and driving voltages from a timing control unit and a power supply unit.

Figure 2:
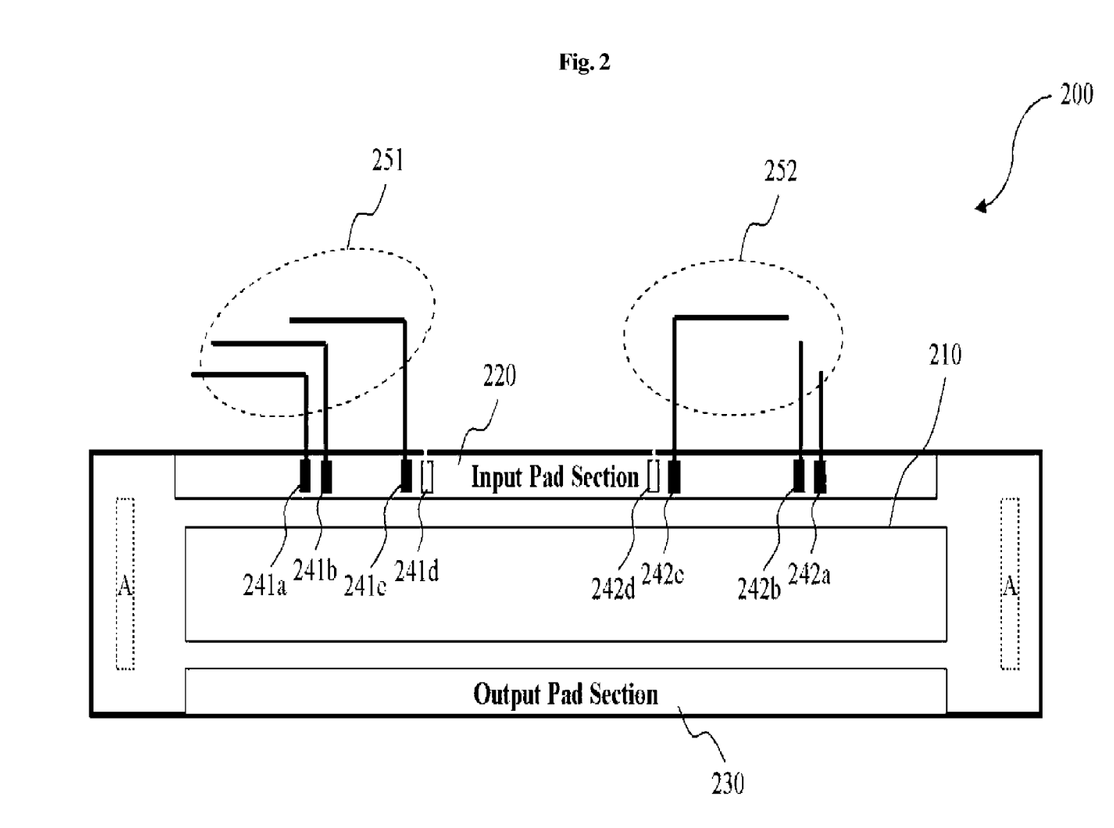
FIG. 2 illustrates the pad layout of a conventional driver IC chip that is mounted according to a COG method.

FIG. 2 illustrates the pad layout of a conventional driver IC chip that is mounted according to the COG method.

Referring to FIG. 2, the driver IC chip may be formed in a rectangular shape having longitudinal sides and transverse sides on the basis of characteristics of a flat panel display device such as an LCD application.

The conventional driver IC chip 200, which is mounted according to the COG method, includes an internal circuit 210 disposed between the longitudinal sides facing each other, an input pad 220 between the internal circuit 210 and one of the longitudinal sides, and an output pad 230 disposed between the internal circuit 210 and the other of the longitudinal sides. The driver IC chip 200 may further include a plurality of power pads 241a to 241d and 242a to 242d and the like, which are disposed therein. Reference numerals 251 and 252 represent power lines formed on glass.

When all of the internal circuit, the input pad, the output pad, the power pads and the like are designed in the driver IC chip of the flat panel display device, the area of the driver IC chip must be increased. As the area of the driver IC chip is increased, the utilization efficiency of glass may be reduced.

Thus, according to the conventional method, when a source driver IC chip and a gate driver IC chip are designed, power pads are disposed at the input pad of the source driver IC chip and the gate driver IC chip, in order to reduce an area occupied by power lines and ground lines. Alternatively, the power pads may be disposed at a left or right side surface A of the source driver IC chip and the gate driver IC chip.

When the power pads are disposed at the input pad or the side surface A of the source driver IC chip and the gate driver IC chip, a force (adhesive force) for bonding the driver IC chip 200 on glass according to the COG method may not be uniformly applied onto the entire adhesion surface of the driver IC chip 200. That is, when the power pads exist only at the input pad, an adhesive force of the input pad section may be larger than an adhesive force of the output pad section. Thus, an electrical connection state of the output pad section having a relatively small adhesive force may be degraded. As a result, an image defect may occur. On the other hand, when the adhesive force of the output pad section is larger than the adhesive force of the input pad section, an electrical connection state of the power pads of the input pad section having a relatively small adhesive force may be degraded. As a result, image noise or frequency defect may occur.

In the source driver IC chip and the gate driver IC chip, the adhesive force may not be uniformly applied because of the structural problem of the pad layout, and an image defect or frequency defect may occur due to the non-uniform adhesive force.

SUMMARY OF THE INVENTION

Accordingly, the present invention has been made in an effort to solve the problems occurring in the related art, and an object of the present invention is to provide a driver IC chip and a pad layout method thereof, which is capable of uniformly applying an adhesive force onto an adhesion surface of a driver IC chip mounted on a flat panel display device according to a COG method.

Another object of the present invention is to provide a driver IC chip and a pad layout method thereof, which applies dummy pads for improving an adhesive force of an adhesion surface of a driver IC chip mounted on a flat panel display device according to a COG method.

In order to achieve the above object, according to one aspect of the present invention, there is provided a driver IC chip including: an input pad section disposed in a longitudinal direction at one of two longitudinal sides of the driver IC chip; an output pad section disposed in the longitudinal direction at the other of two longitudinal sides of the driver IC chip; a first power pad section disposed between an end portion of the input pad section in the longitudinal direction and an end portion of the driver IC chip corresponding to the end portion of the input pad section; a second power pad section disposed between another end portion of the input pad section in the longitudinal direction and an end portion of the driver IC chip corresponding to the another end portion of the input pad section; a third power pad section disposed between an end portion of the output pad section in the longitudinal direction and an end portion of the driver IC chip corresponding to the end portion of the output pad section; and a fourth power pad section disposed between another end portion of the output pad section in the longitudinal direction and an end portion of the driver IC chip corresponding to the another end portion of the output pad section.

According to another aspect of the present invention, there is provided a driver IC chip including: an input pad section disposed at one longitudinal side of a rectangular adhesion surface and including one or two or more input pads arranged in a longitudinal direction; an output pad section disposed at the other longitudinal side of the adhesion surface so as to face the input pad section and including two or more output pads arranged in the longitudinal direction; a first power pad section including first power pads arranged at both sides of the input pad section in the longitudinal direction at the one longitudinal side, the first power pads are arranged seriately to the input pad section; and a second power pad section including second power pads arranged at both sides of the output pad section in the longitudinal direction at the other longitudinal side and providing an adhesive force corresponding to the first power pad section, the second power pads are arranged seriately to the output pad section.

According to another aspect of the present invention, there is provided a pay layout method of a driver IC chip, including: arranging one or two or more input pads in a longitudinal direction at the center of one longitudinal side of a rectangular adhesion surface so as to form an input pad section; arranging two or more output pads in the longitudinal direction at positions of the other longitudinal side of the adhesion surface, corresponding to the input pads, so as to form an output pad section; arranging first power pads at both sides of the input pad section in the longitudinal direction at the one longitudinal side so as to form a first power pad section, the first power pads are arranged seriately to the input pad section; and arranging second power pads at both sides of the output pad section in the longitudinal direction at the other longitudinal side so as to form a second power pad section for providing an adhesive force corresponding to the first power pad, the second power pads are arranged seriately to the output power pad section.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
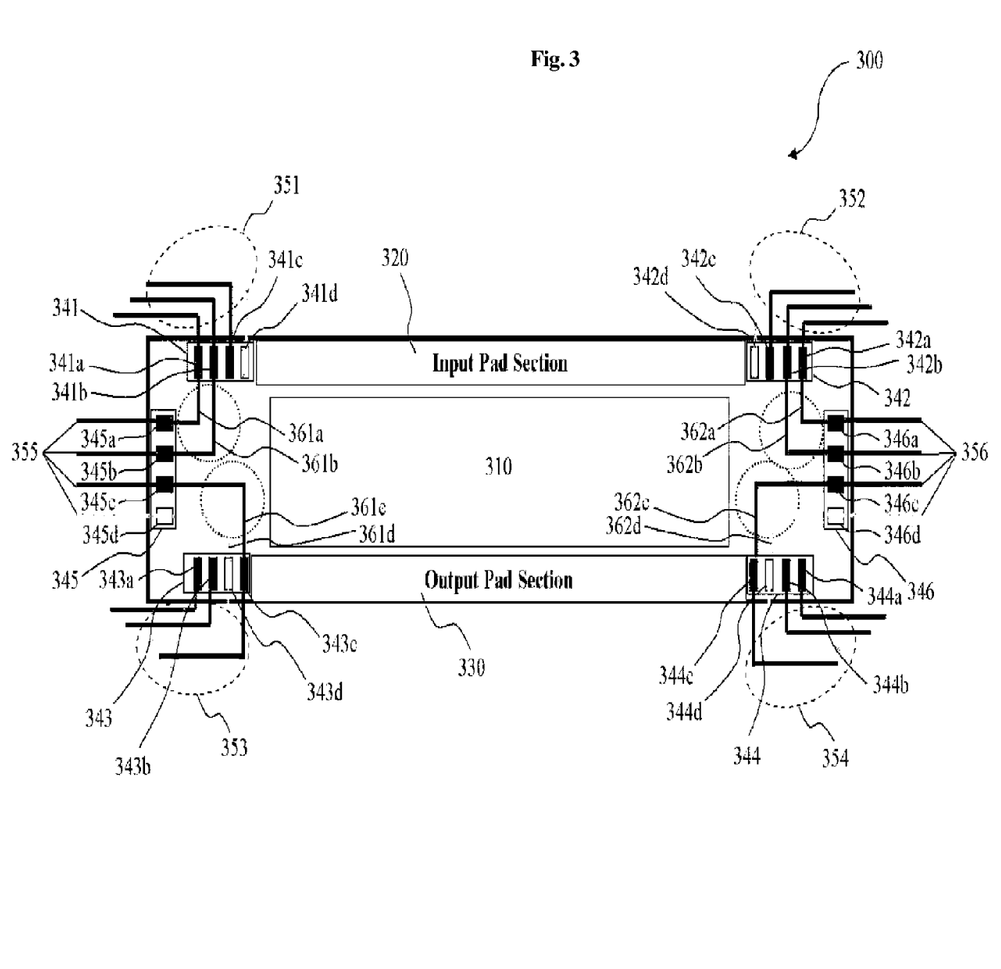
FIG. 3 illustrates a driver IC chip according to an embodiment of the present invention.

FIG. 3 illustrates a pad layout of a driver IC chip according to an embodiment of the present invention. The driver IC chip according to the embodiment of FIG. 3 may be used as a gate driver IC chip or source driver IC chip used in a flat panel display such as an LCD or OLED. The driver IC according to the embodiment of FIG. 3 is based on a COG method in which a driver IC is mounted on glass (not illustrated), and the glass may correspond to glass constituting an LCD panel.

Referring to FIG. 3, the driver IC chip 300 according to the embodiment of the present invention includes a plurality of pads formed on an adhesion surface which is bonded to power lines over the glass through a bump. The pads may be divided into an input pad section 320, an output pad section 330, and a plurality of power pads 341 to 346. Furthermore, the adhesion surface of the driver IC chip 300 indicates a surface on which the plurality of pads are formed and which faces the glass when the driver IC chip 300 is bonded according to the COG method. The adhesion surface of the driver IC chip 300 is represented by the same reference numeral as the driver IC chip 300, for convenience of description.

The driver IC chip 300 includes an internal circuit 310 disposed in the center thereof. The internal circuit 310 is mounted inside a package. The internal circuit 310 of FIG. 3 represents a plan position corresponding to the adhesion surface. Furthermore, the plurality of pads according to the embodiment of FIG. 3 may be formed to be exposed to the adhesion surface facing the glass, for the adhesion through bumps.

According to the embodiment of FIG. 3, the input pad section 320 is disposed in a longitudinal direction at one of two longitudinal sides of the adhesion surface of the driver IC chip 300, and the output pad section 330 is disposed in the longitudinal direction at the other of two longitudinal sides. The input pad section 320 is used as a terminal to receive an external signal such as data or a control signal, and the output pad section 330 is used as a terminal to output a signal processed in the driver IC chip 300. The signal outputted from the output pad section 330 may include a source driving signal in the case of a source driver IC chip and a gate driving signal in the case of a gate driver IC circuit. The input pad section 320 and the output pad section 320 may be disposed in areas deviating from the internal circuit 310 and adjacent to the respective longitudinal sides. Furthermore, the input pad section 320 may include one or more input pads arranged to have the same structure or a symmetrical structure with respect to the center of the longitudinal side, and the output pad unit 330 may include one or more output pads arranged to have the same structure or a symmetrical structure with respect to the center of the longitudinal side.

According to the embodiment of the present invention, the power pads are disposed at the two longitudinal sides of the adhesion surface of the driver IC chip 300, where the input pad section 320 and the output pad section 330 are disposed or the two longitudinal sides and two transverse sides of the driver IC chip 300, unlike the conventional driver IC chip in which the power pads are disposed only at the input pad section or the side surface of the driver IC chip 300.

FIG. 3 illustrates that the power pads are disposed at the two longitudinal sides and the two transverse sides of the driver IC chip 300. The power pads 341*a* to 341*d* disposed at one side of the input pad section 320 positioned at one of the two longitudinal sides of the adhesion surface are referred to as a first power pad section 341, the power pads 342*a* to 342*d* disposed at another side of the input pad section 320 positioned at the one of the two longitudinal sides of the adhesion surface are referred to as a second power pad section 342, the power pads 343*a* to 343*d* disposed at one side of the output pad section 330 positioned at the other of the two longitudinal sides of the adhesion surface are referred to as a third power pad section 343, and the power pads 344*a* to 344*d* disposed at another side of the output pad section 330 positioned at the other of the two longitudinal sides of the adhesion surface are referred to as a fourth power pad section 344. Furthermore, the power pads 345*a* to 345*d* and the power pads 355*a* to 355*d* disposed at the transverse sides in both sides of the adhesion surface are referred to as fifth and sixth power pad sections 345 and 346, respectively.

The first power pad section 341 is disposed at an area closer to an end portion of the input pad section 320 in the longitudinal direction than an end portion of the driver IC chip 300 corresponding to the end portion of the input pad section 320 in the longitudinal direction, the second power pad section 342 is disposed at an area closer to another end portion of the input pad section 320 in the longitudinal direction than an end portion of the driver IC chip 300 corresponding to the another end portion of the input pad section 320 in the longitudinal direction. The third power pad section 343 is disposed at an area closer to an end portion of the output pad section 330 in the longitudinal direction than an end portion of the driver IC chip 300 corresponding to the end portion of the output pad section 320 in the longitudinal direction. The fourth power pad section 344 is disposed at an area closer to another end portion of the output pad section 330 in the longitudinal direction than the end portion of the driver IC chip 300 corresponding to the another end portion of the output pad section 330 in the longitudinal direction.

The respective power pads of the first to sixth power pad sections 341 to 346 may be electrically connected to power lines 351 to 356 for supplying power, and the power lines 351 to 356 may include power lines formed on glass according to the LOG method. That is, the power pads at the longitudinal sides and the power pads at the transverse sides may be connected through the power lines formed in the LOG method so as to bypass the driver IC chip 300.

The first to sixth power pad section 341 to 346 may include the first power pads 341*a* to 346*a* for supplying a first power VDD, the second power pads 341*b* to 346*b* for supplying a second power VSS1, the third power pads 341*c* to 346*c* for supplying a third power VCC, and the fourth power pads 341*d* to 346*d* for supplying a fourth power VSS2.

At this time, the first power VDD may be used as a power supply voltage for processing a digital signal, the second power VSS1 may be used as a ground voltage for processing a digital signal, the third power VCC may be used as a power supply voltage for processing an analog signal, and the fourth power VSS2 may be used as a ground voltage for processing an analog signal.

The first power pad section 341 formed at one end portion of the input pad section 320 in the longitudinal direction on the adhesion surface of the driver IC chip 300 is electrically connected to the fifth power pad section 345 positioned at an area closer to the first power pad section 341 between the fifth and sixth power pad sections 345 and 346 disposed at both sides of the adhesion surface of the driver IC chip 300. At this time, a first power pad 341*a* of the first power pad section 341 and a first power pad 345*a* of the fifth power pad section 345 are connected through a first power pad connection line 361*a*, and a second power pad 341*b* of the first power pad section 341 and a second power pad 345*b* of the fifth power pad section 345 are connected through a second power pad connection line 361*b*.

The third power pad section 343 formed at one end portion of the output pad section 330 in the longitudinal direction on the adhesion surface of the driver IC chip 300 is electrically connected to the fifth power pad section 345 positioned at an area closer to the third power pad section 343 between the fifth and sixth power pad sections 345 and 346 disposed at both sides of the adhesion surface of the driver IC chip 300. At this time, a third power pad 343*c* of the third power pad section 343 and a third power pad 345*c* of the fifth power pad section 345 are connected through a third power pad connection line 361*c*, and a fourth power pad 343*d* of the third power pad section 343 and a fourth power pad 345*d* of the fifth power pad section 345 are connected through a fourth power pad connection line 361*d*.

The first power pad connection line 361*a*, the second power pad connection line 361*b*, the third power pad connection line 361*c*, and the fourth power pad connection line 361*d* may be formed on glass according to the LOG method or formed in the driver IC 300.

The second power pad section 342 formed at another end portion of the input pad section 320 in the longitudinal direction on the adhesion surface of the driver IC chip 300 is connected to the sixth power pad section 346 positioned at an area closer to the second power pad section 342 between the fifth and sixth power pad sections 345 and 346 disposed at both sides of the driver IC chip 300. At this time, a first power pad 342*a* of the second power pad section 342 and a first power pad 346*a* of the sixth power pad section 346 are connected through a first power pad connection line 362*a*, and a second power pad 342*b* of the second power section 342 and a second power pad 346*b* of the sixth power pad section 346 are connected through a second power pad connection line 362*b*.

The fourth power pad section 344 formed at another end portion of the output pad section 330 in the longitudinal direction on the adhesion surface of the driver IC 300 is connected to the sixth power pad section 346 positioned at an area closer to the fourth power pad section 344 between the fifth and sixth power pad sections 345 and 346 disposed at both sides of the driver IC chip 300. At this time, a third power pad 344*c* of the fourth power pad section 344 and a third power pad 346*c* of the sixth power pad section 346 are connected through a third power pad connection line 362*c*, and a fourth power pad 344*d* of the fourth power pad section 344 and a fourth power pad 346d of the sixth power pad section 346 are connected through a fourth power pad connection line 362d.

The first power pad connection line 362a, the second power pad connection line 362b, the third power pad connection line 362c, and the fourth power pad connection line 362d may be formed on glass according to the LOG method or formed in the driver IC chip 300. According to the embodiment of FIG. 3, the first and second power pad sections 341 and 342 are formed at one longitudinal side of the adhesion surface of the driver IC chip 300, where the input pad section 320 is formed, and the third and fourth power pads sections 343 and 344 for providing an adhesive force corresponding to the adhesive force of the first and second power pad sections 341 and 342 are formed at the other longitudinal side where the output pad section 330 is formed. Thus, according to the embodiment of FIG. 3, the adhesive force of the adhesion surface may be uniformly applied to the entire surface.

Furthermore, according to the embodiment of FIG. 3, the fifth and sixth power pad sections 345 and 346 are formed at two transverse sides of the adhesion surface of the driver IC chip 300. Thus, the adhesive force of the adhesion surface may be more uniformly applied to the entire surface.

Figure 4:
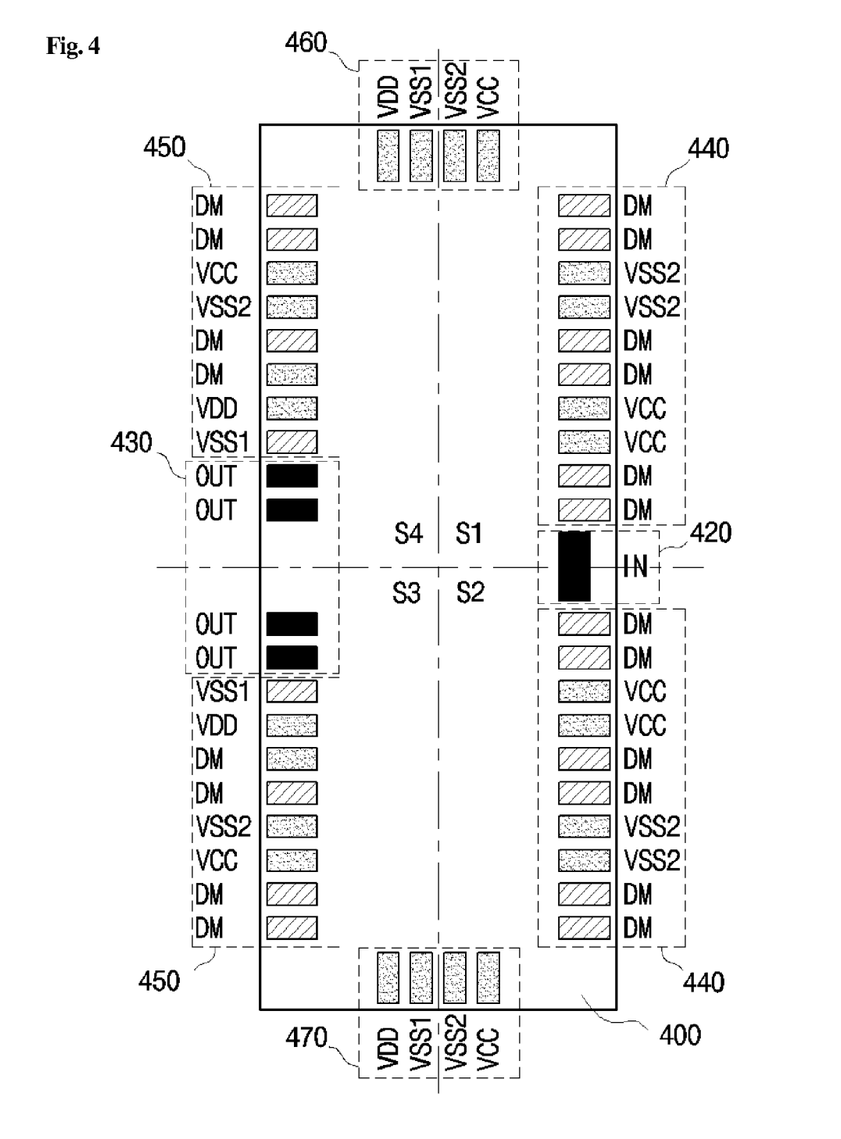
FIG. 4 illustrates a driver IC chip according to another embodiment of the present invention.

The embodiment of the present invention may be configured as illustrated in FIG. 4.

According to the embodiment of FIG. 4, an input pad IN constituting an input pad section 420 is formed at one of two longitudinal sides of a rectangular adhesion surface of a driver IC chip 400, and four output pads OUT constituting an output pad section 430 are formed at the other of the two longitudinal sides. FIG. 4 illustrates that the input pad section 420 include one input pad IN. However, the present invention is not limited thereto, but the input pad section 420 may include a plurality of input pads IN arranged in the longitudinal direction. Furthermore, FIG. 4 illustrates that the output pad section 430 includes four output pads OUT. However, the present invention is not limited thereto, but the output pad section 430 may include two or more output pads arranged in the longitudinal direction.

The input pad section 420 and the output pad section 430 may be configured to have the same or a symmetrical structure with respect to the center of the longitudinal side, and may have different lengths from each other. The length difference between the input pad section 420 and the output pad section 430 may cause a difference in adhesive force. The difference in adhesive force, caused by the length difference between the input pad section 420 and the output pad section 430, may be compensated for by dummy pads DM formed in the first power pad section 440.

The embodiment of FIG. 4 includes a first power pad section 440 formed at the one of the two longitudinal sides. The first power pad section 440 includes first power pads VCC, VSS2, and DM arranged at both sides of the input pad section 420 in the longitudinal direction. The first power pads VCC, VSS2, and DM of the first power pad section 440 may be arranged seriately to the input pad section 430.

Furthermore, the embodiment of FIG. 4 includes a second power pad section 450 formed at the other of the two longitudinal sides. The second power pad section 450 includes second power pads VCC, VDD, VSS1, VSS2, and DM arranged at both sides of the output pad section 430 in the longitudinal direction. The second power pads VCC, VDD, VSS1, VSS2, and DM of the second power pad 450 may be arranged seriately to the power pad section 430, in order to provide an adhesive force corresponding to the first power pad section 440.

In the embodiment of FIG. 4, the first power pads of the first power pad section 440 include one or more power pads VCC for a power supply voltage for processing an analog signal, one or more power pads VSS2 for a ground voltage for processing an analog signal, and one or more dummy pads DM. Furthermore, the second power pads of the second power pad 450 include one or more power pad VDD for a power supply voltage for processing a digital signal, one or more power pads VCC1 for a ground voltage for processing a digital signal, a power pad VCC for a power supply voltage for processing an analog signal, a power pad VSS2 for a ground voltage for processing an analog signal, and one or more dummy pads DM.

The number of the first power pads VCC, VSS1 and DM of the first power pad section 440 and the number of the second power pads VCC, VDD, VSS1, VSS2 and DM of the second power pad section 450 may be set to be equal to each other, in order to uniformize the adhesive force. Furthermore, the first power pad section 440 and the second power section 450 may have the same structure or a symmetrical structure. FIG. 4 illustrates a symmetrical structure.

Furthermore, the first power pads VCC, VSS1 and DM of the first power pad section 440 and the second power pads VCC, VDD, VSS1, VSS2 and DM of the second power pad section 450 may be arranged to the have the same structure or a symmetrical structure with respect to the center of the longitudinal side, in order to equalize the adhesive force. The embodiment of FIG. 4 has a symmetrical structure.

As described above, the first and second power pad sections 440 and 450 include one or more dummy pads DM. The dummy pads DM are formed to compensate for a pattern such that the first and second power pad sections 440 and 450 arranged to have the same structure or a symmetrical structure. The dummy pads DM may be arranged symmetrically with respect to the center of the longitudinal side in one or more of the first and second power pad sections 440 and 450. Furthermore, the first power pad section 440 may include a dummy pad DM formed in an area adjacent to the input pad section 420 so as to compensate for a length difference between the input pad section 420 and the output pad section 430.

The first and second power pad sections 440 and 450 may include one or more power pads formed in an area divided on the basis of the center of the longitudinal side and configured to provide the same power.

A pad layout method for forming the embodiment of FIG. 4 includes arranging one or two or more input pads at one longitudinal side of a rectangular adhesion surface in a longitudinal direction so as to form the input pad section 420; arranging two or more output pads at positions of the other longitudinal side of the adhesion surface, corresponding to the input pads, in the longitudinal direction so as to form the output pad section 430; and arranging first power pads formed at the one longitudinal side so as to form the first power pad section 440, such that the first power pads are arranged seriately to the input pad at both sides of the input pad section 420 in the longitudinal direction; and arranging second power pads formed at the other longitudinal side so as to form the second power pad section 450 for providing an adhesive force corresponding to the first power pad section 440, such that the second power pads are are arranged seriately to the output pads at both sides of the output pad section 430 in the longitudinal direction.

The embodiment of FIG. 4 may include a third power pad section 460 and a fourth power pad section 470 which are formed at transverse sides in both sides of the adhesion surface of the driver IC chip 400, and the third and fourth power pad section 460 and 470 include four power pads VDD, VSS1, VCC and VSS2 as third and fourth power pads, respectively. The embodiment of FIG. 4 may have an adhesive force increased by the third and fourth power pad sections 460 and 470. As a result, a uniform adhesive force may be applied to the adhesion surface of the driver IC chip 400.

The third power pads VDD, VSS1, VCC and VSS2 of the third power pad section 460 and the fourth power pads VDD, VSS1, VCC and VSS2 of the fourth power pad section 470 may be arranged symmetrically with respect to the center of the longitudinal side.

In the embodiment of FIG. 4, power pads at one side of the center of the first and second power pad sections 440 and 450 may be electrically connected to the power pads of the third power pad section 460 through a first power pad connection line (not illustrated). Furthermore, power pads at the other side of the center of the first and second power pad sections 440 and 450 may be electrically connected to the power pads of the fourth power pad section 470 through the second power pad connection line (not illustrated). The first and second power pad connection lines may be formed in an LOG type so as to bypass the driver IC chip.

As described above with reference to FIGS. 3 and 4, the adhesive force may be uniformly applied onto the entire surfaces of the driver IC chips 300 and 400. Thus, it is possible to prevent an image defect, image noise or noise defect which may occur due to an adhesion defect, when the driver IC chips 300, 400 is bonded according to a COF method.

Furthermore, the power pads are formed at four sides of the driver IC chips 300 and 400. Thus, the embodiments of the present invention not only may uniformly provide an adhesive force for four sides, but also may provide power according to various mounting methods.

The embodiments of the present invention may be applied to a panel for a source driver IC cascade type COG, a GIP (Gate In Panel) for a source driver IC cascade type COG, and an LCD module or LCD display system fabricated using the panel.

According to the embodiments of the present invention, the adhesion surface of the driver IC chip mounted on a flat panel display device according to the COG method may have a uniform adhesive force through the pads which are uniformly distributed at the longitudinal sides or transverse sides. Thus, the adhesion state between the driver IC chip and the glass may be improved, and an image defect, image noise and frequency defect may be prevented.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A driver IC chip comprising:
an input pad section disposed in a longitudinal direction at one of two longitudinal sides of the driver IC chip;
an output pad section disposed in the longitudinal direction at the other of two longitudinal sides of the driver IC chip;
a first power pad section disposed between an end portion of the input pad section in the longitudinal direction and an end portion of the driver IC chip corresponding to the end portion of the input pad section, and at an area closer to the end portion of the input pad section than the end portion of the driver IC chip corresponding to the end portion of the input pad section;
a second power pad section disposed between another end portion of the input pad section in the longitudinal direction and an end portion of the driver IC chip corresponding to the another end portion of the input pad section, and at an area closer to the another end portion of the input pad section than the end portion of the driver IC chip corresponding to the another end portion of the input pad section;
a third power pad section disposed between an end portion of the output pad section in the longitudinal direction and an end portion of the driver IC chip corresponding to the end portion of the output pad section, and at an area closer to the end portion of the output pad section than the end portion of the driver IC chip corresponding to the end portion of the output pad section; and
a fourth power pad section disposed between another end portion of the output pad section in the longitudinal direction and an end portion of the driver IC chip corresponding to the another end portion of the output pad section, and at an area closer to the another end portion of the output pad section than the end portion of the driver IC chip corresponding to the another end portion of the output pad section.

2. The driver IC chip according to claim 1, wherein each of the first, second, third and fourth power pad sections comprises:
a first power pad that provides a first power to the driver IC chip;
a second power pad that provides a second power to the driver IC chip;
a third power pad that provides a third power to the driver IC chip; and
a fourth power pad that provides a fourth power to the driver IC chip.

3. The driver IC chip according to claim 1, wherein each of the first to fourth power pad sections comprises two or more power pads, and two or more of the first to fourth power pad sections comprise the power pads for the same power.

4. The driver IC chip according to claim 1, further comprising:
a fifth power pad section disposed at one of two transverse sides of the driver IC chip; and
a sixth power pad section disposed at the other of the two transverse sides of the driver IC chip.

5. The driver IC chip according to claim 4, wherein each of the first to fourth sixth power pad sections comprises two or more power pads, and
the driver IC chip further comprises one or more first power pad connection lines for electrically connecting the first, third and fifth power pad sections and one or more second power pad connection lines for electrically connecting the second, fourth and sixth power pad sections.

6. A driver IC chip comprising:
an input pad section disposed at one longitudinal side of a rectangular adhesion surface and comprising one or two or more input pads arranged in a longitudinal direction;
an output pad section disposed at the other longitudinal side of the adhesion surface so as to face the input pad section and comprising two or more output pads arranged in the longitudinal direction;
a first power pad section comprising first power pads arranged at both sides of the input pad section in the longitudinal direction at the one longitudinal side, the first power pads are arranged seriately to the input pad section; and a second power pad section comprising second power pads arranged at both sides of the output pad section in the longitudinal direction at the other longitudinal side and providing an adhesive force corresponding to the first power pad section, the second power pads are arranged seriately to the output pad section,
wherein the first and second power pad sections comprise one or more first and second power pads for the same power in an area divided on the basis of the center of the longitudinal side.

7. The driver IC chip according to claim 6, wherein the first power pads of the first power pad section and the second power pads of the second power pad section are arranged to have the same or a symmetrical structure, in order to equalize the adhesive force.

8. The driver IC chip according to claim 6, wherein the first power pads of the first power pad section and the second power pads of the second power pad section are arranged to have the same or a symmetrical structure with respect to the center of the longitudinal side, in order to equalize the adhesive force.

9. The driver IC chip according to claim 6, wherein each of the first and second power pads comprises one or more dummy pads.

10. The driver IC chip according to claim 9, wherein the input pad section and the output pad section are formed to have different lengths from each other, and
the first power pads of the first power pad section or the second power pads of the second power pad section comprise the dummy pads formed in an area where a length difference occurs between the input pad section and the output pad section.

11. The driver IC chip according to claim 9, wherein the dummy pads of the first and second power pad sections are formed to compensate for pad layouts of the first and second power pad sections such that the pad layouts have the same or a symmetrical structure.

12. The driver IC chip according to claim 9, wherein any one of the first and second power pad sections have the dummy pads arranged symmetrically with respect to the center of the longitudinal side.

13. The driver IC chip according to claim 6, wherein the first and second power pad sections comprise one or more first and second power pads for the same power.

14. The driver IC chip according to claim 6, further comprising:
a third power pad section disposed at one transverse side of the adhesion surface and comprising two or more third power pads; and
a fourth power pad section disposed at the other transverse side of the adhesion surface and comprising two or more fourth power pads,
wherein the drive IC chip has the adhesive force increased by the third and fourth power pad sections.

15. The driver IC chip according to claim 14, wherein the third power pads of the third power pad section and the fourth power pads of the fourth power pad section are arranged to have a symmetrical structure with respect to the center of the longitudinal side.

16. The driver IC chip according to claim 14, further comprising:
one or more first power pad connection lines for connecting the first and second power pads at one side of the center of the first and second power pad sections to the third power pads of the third power pad section; and
one or more second power pad connection lines for connecting the first and second power pads at the other side of the center of the first and second power pad sections to the third power pads of the third power pad section.

17. A pad layout method of a driver IC chip, comprising:
arranging one or two or more input pads in a longitudinal direction at the center of one longitudinal side of a rectangular adhesion surface so as to form an input pad section;
arranging two or more output pads in the longitudinal direction at positions of the other longitudinal side of the adhesion surface, corresponding to the input pads, so as to form an output pad section which has a length different from the input pad section;
arranging first power pads at both sides of the input pad section in the longitudinal direction at the one longitudinal side so as to form a first power pad section, the first power pads are arranged seriately to the input pad section; and
arranging second power pads at both sides of the output pad section in the longitudinal direction at the other longitudinal side so as to form a second power pad section for providing an adhesive force corresponding to the first power pad, the second power pads are arranged seriately to the output power pad section,
wherein the first and second power pad sections are formed to comprise one or more first and second power pads for the same power in an area divided on the basis of the center of the longitudinal side.

18. The pad layout method of the driver IC chip according to claim 17, wherein the first power pads and the second power pads are formed symmetrically with respect to one or more of the center of a transverse side and the center of the longitudinal side of the adhesion surface.

* * * * *